United States Patent [19]

Yamagiwa

[11] 4,249,091
[45] Feb. 3, 1981

[54] LOGIC CIRCUIT
[75] Inventor: Akira Yamagiwa, Ohiso, Japan
[73] Assignee: Hitachi, Ltd., Japan
[21] Appl. No.: 940,009
[22] Filed: Sep. 6, 1978
[30] Foreign Application Priority Data
  Sep. 9, 1977 [JP] Japan .................. 52-107799
[51] Int. Cl.³ .............. H03K 19/086; H03K 19/003
[52] U.S. Cl. ............................ 307/203; 307/214; 307/297; 307/310; 307/317 A; 307/362
[58] Field of Search ............... 307/297, 310, 362, 218, 307/215, 214, 317 A, 203

[56] References Cited

U.S. PATENT DOCUMENTS

| | | | |
|---|---|---|---|
| 3,502,900 | 3/1970 | Straub ................................ | 307/203 |
| 3,751,680 | 8/1973 | Hodges ............................. | 307/317 A |
| 3,758,791 | 9/1973 | Taniguchi et al. ............... | 307/297 X |

OTHER PUBLICATIONS

T. W. Bayer et al., "FET to Bipolar Receiver with Overvoltage Protection", IBM Technical Disclosure Bulletin, vol. 18, No. 8, Jan. 1976, p. 2510.

Primary Examiner—John Zazworsky
Attorney, Agent, or Firm—Craig and Antonelli

[57] ABSTRACT

A current mode logic circuit (CML) consisting of emitter-coupled transistors, one acting as a reference element and the other as an input element, a regulation transistor for regulating the emitter current of the transistors, a biasing circuit composed of a diode, a Schottky diode and a resistance element connected in series between a $V_{EE}$ terminal and a $V_{CC}$ terminal and a biasing transistor, the collector of the biasing transistor being connected through a resistor to $V_{CC}$ and connected to the base of the reference transistor, the emitter of which being connected through a resistor to $V_{EE}$, the bases of the regulation transistor and the biasing transistor being connected to the point between the resistance element and the Schottky diode, so that the emitter current of the transistors and the reference voltage are automatically regulated, whereby CML maintains both the output levels and the input threshold level almost invariant irrespective of changes of transistor characteristics due to temperature and changes in supply voltage, to provide a circuit which is capable of operating on low-power potential and low-amplitude input signal.

10 Claims, 4 Drawing Figures

LOGIC CIRCUIT

BACKGROUND OF THE INVENTION

1. Field of the Invention

This invention relates to logic circuits, and more particularly to a current mode logic circuit in which the DC levels of the output signals and input threshold are almost kept invariant irrespective of changes in temperature and supply voltage.

2. Description of the Prior Art

The conventional current switch circuit consists of a so-called reference transistor of which a reference voltage is impressed on the base and a so-called input transistor of which an input signal to the circuit is impressed on the base, both transistors being connected with the emitters common.

A typical circuit including the current switch circuit as the basic component is a circuit known as a CML (current mode logic) which includes a plurality of input transistors, the respective emitters as well as collectors of the input transistors being mutually connected respectively, so that an OR output can be taken out from the collector of the reference transistor and a NOR output from the common collector lead of the input transistors.

The CML in which the transistors are operated in the respective non-saturation regions so as not to be affected by the stored charge, is an effective logic circuit compatible with the so-called CTL (complementary transistor logic) especially in the operation speed. In the practical use of a CML, a further stage of an emitter follower is connected to each output circuit of the reference and the input transistors so as to reduce the output impedance and to equalize the levels of the input and output signals.

Conventional current switch circuits including the above-mentioned CML, however, have a common drawback that the DC voltage levels of the output signals and input threshold are changed by the temperature supply voltage.

The Variation of DC voltage levels and input threshold in temperature are caused by the temperature dependence of the forward base-emitter voltage, and the variation in supply voltage are caused by the biasing variation of a regulation transistor.

For example, with a typical practical CML which is designed so as to have a logic swing voltage of approximately 0.8 V with the "1" level of the output signal set at −0.9 V or so, the "0" level at −1.7 V or so and the reference level at −1.3 V or so, the "1" level signal is subject to the variations with a temperature coefficient of about 1.3 to 2.0 mV/° C., especially under the influence of transistors of the emitter followers. As for the "0" level signal, the temperature coefficient of the drift is found to be about 0.5 to 0.8 mV/° C. which is much lower than that for the "1" level signal. This is due to the fact that the "0" level signal is affected also by the temperature characteristics of the input transistors and reference transistors which more or less compensate for the influence of the drift of the emitter follower transistors.

Anyway, such temperature dependence of the output levels results in a poor immunity of the signal against noise in the conventional CML. Especially if the conventional CML is fabricated in an integrated circuit formation, such a circuit would sometimes fail to operate at the intended logic swing voltage, as the component circuit elements are not allowed sufficient heat dissipation. Further, the limit level of the input signal below which the logic circuit can operate in a non-saturation state, also varies with the temperature coefficient of about −1.5 to −1.8 mV/° C. in a range of −0.4 to −0.8 V. Therefore, if the "1" level signal rises with a temperature rise, it is possible for the signal level to trespass on the saturation region, exceeding the above-mentioned limit level. This necessitates a more limited tolerance of the temperature characteristics of the component circuit elements.

It is, however, a modern trend to integrate the logic circuits to large scales accompanied by the generation of increased amount of heat, thereby presenting a problem of temperature dependence of the logic circuits.

To integrate the logic circuits to a large scale, therefore, they must operate on a power supply of a voltage which is as small as possible, and on input signals of small amplitude. However, there is posed a limit in regard to the voltage of the power supply and the amplitude of the input signals due to the temperature dependence of the output level and the voltage dependence of the power supply.

SUMMARY OF THE INVENTION

It is, therefore, an object of the invention to provide an improved logic circuit of which DC levels of output signals are almost invarient irrespective of changes of transistor characteristics due to temperature. A further object is to provide a current switch circuit of which DC levels of output signals are almost invarient irrespective of changes of transistor characteristics due to temperature and changes in supply voltage.

A further object is to provide a current mode logic circuit which renders both the output levels and the input threshold level substantially invariant regardless of changes of transistor characteristics due temperature and changes in supply voltage.

A further object is to provide a current mode logic circuit which is capable of operating on low-power potential and low-amplitude input signal.

These and other objects of the invention are achieved by providing the current mode logic circuit including emitter-coupled transistors, one acting as a reference element and the other as an input element; a regulation transistor for regulating the emitter current of the transistors via common emitter; and a biasing circuit having a series connection of a diode and a Schottky diode, said means generating a predetermined voltage between the emitter and the base of said regulation transistors, and a biasing transistor, the collector thereof being coupled to the base of said reference transistor thereby to generate the reference voltage, the biasing of the base-emitter thereof being generated by said series connection.

The prior art related to this invention is disclosed in the U.S. patents of Taniguchi et al., U.S. Pat. No. 3,758,791, D. Straub U.S. Pat. No. 3,502,900 and Hodges U.S. Pat. No. 3,751,680.

It is disclosed in these patents that the DC levels of the output voltages of current switch circuit are not affected by temperature variations of transistors (Taniguchi et al. patent), the biasing circuit of the signal control circuit has the series connection of diodes as shown in FIG. 6 (D. Straub patent), and the double-clamped Schottky transistor logic gate circuit includes level shifting Schottky diodes (Hodges patent).

Other objects, features and merits of this invention will be clarified by the following description with reference to the accompanying drawings.

DESCRIPTION OF THE PREFERRED EMBODIMENTS

Figure 1:
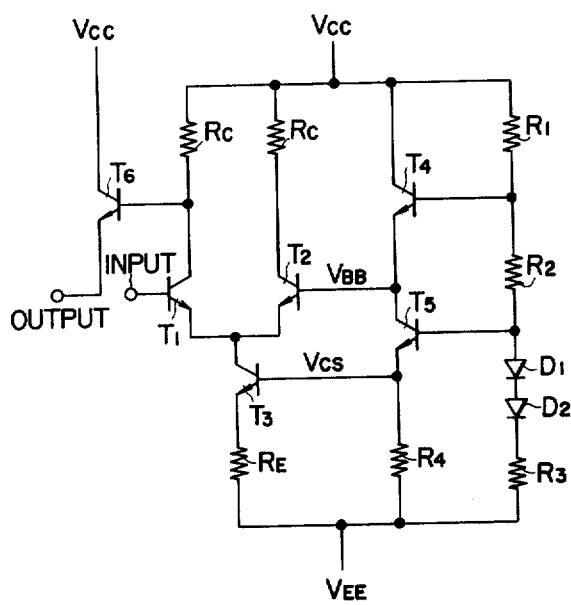
FIG. 1 is a current mode logic circuit in prior art having an emitter follower transistor circuit.

FIG. 1 shows a CML circuit having an emitter follower according to conventional art. In this circuit, the output of gate is taken out via an emitter follower transistor $T_6$. Therefore, the output level is dependent upon the temperature. The emitters of the transistors $T_1$ and $T_2$ are connected in common together, and the collectors are connected to a most positive power-supply voltage terminal $V_{CC}$ via load resistors $R_C$ and $R_C$, respectively. The terminal $V_{CC}$ is at ground potential, the base of the transistor $T_1$ receives input signals, and the base of the transistor $T_2$ is served with a reference voltage. The collector of the transistor $T_1$ is connected to the base of the emitter follower transistor $T_6$. The collector of the transistor $T_6$ is connected to $V_{CC}$, and the emitter produces output signals. The transistor $T_3$ is a regulation transistor with its collector being connected to a common emitter of the transistors $T_1$ and $T_2$, and the emitter thereof being connected to a most negative power-supply voltage terminal $V_{EE}$ via a transistor $R_E$.

A series circuit composed of transistors $T_4$, $T_5$ and a resistor $R_4$ is connected between the terminal $V_{CC}$ and the terminal $V_{EE}$, the node of the emitter of the transistors $T_4$ and the collector of the transistor $T_5$ is connected to the base of the transistor $T_2$ to give a reference voltage, and the node of the transistor $T_5$ and the resistor $R_4$ is connected to the base of the transistor $T_3$ to give a biasing voltage that will be used to effect the regulation.

A series circuit consisting of a resistor $R_1$, resistor $R_2$, type diode $D_1$, junction type diode $D_2$, and resistor $R_3$ is connected between the terminal $V_{CC}$ and the terminal $V_{EE}$, the node of the resistors $R_1$ and $R_2$ is connected to the base of the transistor $T_4$, and the node of the resistor $R_2$ and the diode $D_1$ is connected to the base of the transistor $T_5$, thereby to form a biasing circuit for the transistors $T_4$ and $T_5$.

By using the resistors $R_1$ to $R_4$, diodes $D_1$ and $D_2$, and transistors $T_4$ and $T_5$, a reference voltage level $V_{BB}$ is applied to the base of the transistor $T_2$, and a current-source voltage level $V_{CS}$ is applied to the base of the current-supply transistor $T_3$. The diodes $D_1$ and $D_2$ give a temperature compensation to the $V_{BB}$ and $V_{CS}$ suit for the high output level. In an ordinary CML circuit, the signal amplitude is about 0.8 volt, and the high output level $V_{OH}$ is selected to be about $-0.9$ volt, the low output level $V_{OL}$ is selected to be about $-1.7$ volts, and the reference voltage level $V_{BB}$ is selected to be about $-1.3$ volts. To integrate the circuits into a large scale, it is necessary to reduce the voltage of the power supply and to reduce the amplitude of the signals. With the circuit of FIG. 1, if it is intended to reduce the voltage of the power supply, the reference voltage level $V_{BB}$ is fixed to $-1.3$ volts, whereby the saturation of the transistor $T_3$ makes it difficult to increase the current-source voltage level $V_{CS}$ and to decrease the voltage level of the terminal $V_{EE}$. Even if the amplitude is halved to 0.4 volt, with the high output level $V_{OH}$ being set at $-0.9$ volt, the low output level $V_{OL}$ being set at $-1.3$ volts, and the reference voltage level $V_{BB}$ being set at $-1.1$ volts, the power-supply voltage can be reduced by only 400 millivolts which is equal to the shifted amount of $V_{BB}$.

Figure 2:
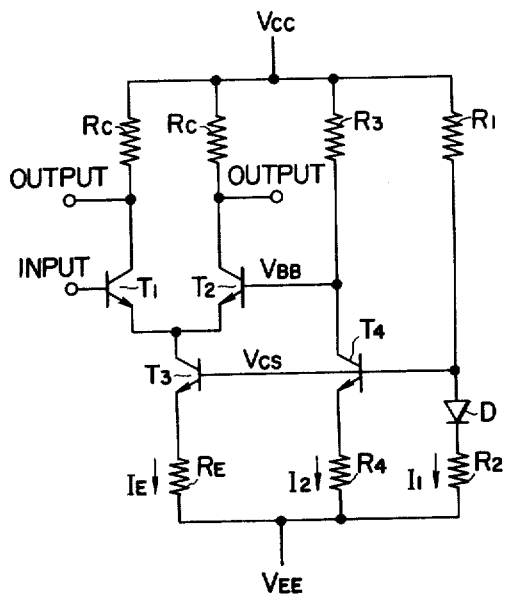
FIG. 2 is a current mode logic circuit in prior art without having emitter follower transistor circuit.

If the emitter follower transistor $T_6$ is removed from the circuit of FIG. 1 to constitute a circuit of FIG. 2, the high output level $V_{OH}$ becomes about 0 volt making it possible to avoid the saturation of the transistors $T_1$ and $T_2$. Accordingly, the amplitude can be set at 0.4 volt, and the low output level $V_{OL}$ can be set at $-0.4$ volt. Therefore, the reference voltage level $V_{BB}$ can be set at $-0.2$ volt, and the emitter voltage level of the transistor $T_2$ can be set at $-0.9$ volt, since the base-emitter voltage level $V_{BE}$ is about 0.7 volt. The current-source voltage level $V_{CS}$ will be $-0.9$ volt if it is selected to be equal to the emitter voltage of the transistor $T_2$. If the ratio of the collector resistance $R_C$ to the emitter resistance $R_E$ is set at 1, the $V_{EE}$ can be set at a power-supply voltage which is as low as $-2.0$ volts.

According to the circuit of FIG. 2, the base of the transistor $T_2$ is connected to a node between the resistor $R_3$ and the collector of the transistor $T_4$ which together constitute the series circuit of the resistor $R_1$, transistor $T_4$ and resistor $R_4$ connected between the terminal $V_{CC}$ and the terminal $V_{EE}$, and is served with the reference voltage. The base of the transistor $T_3$, on the other hand, is connected to a node between the resistor $R_1$ and the juction type diode D which elements constitute the series circuit of resistor $R_1$, diode D and resistor $R_2$ connected between the terminal $V_{CC}$ and the terminal $V_{EE}$, and therefore receives the biasing voltage.

Below will be examined the temperature dependence of the output level of the circuit of FIG. 2, and the temperature dependence of the reference voltage for determining the threshold level of the input signals.

First, for the purpose of simplicity, the current amplification factor of the transistor is set at $h_{FE}=\infty$. If the current flowing through the resistor $R_2$ is denoted by $I_1$, and if the voltage drop of the diode D at this moment is denoted by $V_D(I_1)$, the base voltage level $V_{CS}$ of the transistor $T_3$ can be found as follows:

$$I_1(R_1 + R_2) + V_D(I_1) = V_{CC} - V_{EE} \quad (1)$$
$$I_1 = \frac{V_{CC} - V_{EE} - V_D(I_1)}{R_1 + R_2}$$
$$V_{CS} = V_{CC} - I_1 R_1$$
$$= V_{CC} - \frac{R_1}{R_1 + R_2}(V_{CC} - V_{EE} - V_D(I_1))$$

where $V_{CC}$ and $V_{EE}$ represent the potentials at the terminals $V_{CC}$ and $V_{EE}$.

If the current flowing through the resistor $R_E$ is denoted by $I_E$, and the forward base-emitter voltage of the transistor $T_3$ is denoted by $V_{BE}(I_E)$, the current $I_E$ will be found in the following way:

$$V_{CS} - V_{BE}(I_E) - I_E \cdot R_E = V_{EE}$$
$$I_E = \frac{V_{CS} - V_{BE}(I_E) - V_{EE}}{R_E}$$

The low output level Vol is, $$V_{OL} = V_{CC} - \alpha^2 I_E R_C$$

Here, since $$\alpha = \frac{h_{FE}}{h_{FE} + 1}, \quad h_{FE} = \infty$$

We obtain $\alpha \approx 1$.
Therefore, $$V_{OL} = V_{CC} - I_E \cdot R_C \quad (2)$$
$$= V_{CC} - \frac{R_C}{R_E}(V_{CS} - V_{BE}(I_E) - V_{EE})$$

If the current switch is completely switched, there flows no current to the corrector resistance $R_C$, so that the high output level is given by $$V_{OH} = 0 \quad (3)$$

If the current flowing through the resistor $R_4$ is denoted by $I_2$, the current $I_2$ can be found in the following way:

$$V_{CS} - V_{BE}(I_2) - R_4 \cdot I_2 = V_{EE}$$
$$I_2 = \frac{V_{CS} - V_{BE}(I_2) - V_{EE}}{R_4}$$

The reference voltage level $V_{BB}$ can be found as follows:

$$V_{BB} = V_{CC} - R_3 \cdot I_2 \quad (4)$$
$$= V_{CC} - \frac{R_3}{R_4}(V_{CS} - V_{BE}(I_2) - V_{EE})$$

From the equations (2), (3) and (4), when the temperature is changed by $\Delta T_j$, the temperature dependence of the output level can be found, from the equation (2), as follows:

$$\frac{\Delta V_{OL}}{\Delta T_j} = -\frac{R_C}{R_E}\left(\frac{\Delta V_{CS}}{\Delta T_j} - \frac{\Delta V_{BE}}{\Delta T_j}\right) \quad (4)'$$

Here, from equation (1), $$\frac{\Delta V_{CS}}{\Delta T_j} = \frac{R_1}{R_1 + R_2} \cdot \frac{\Delta V_D}{\Delta T_j}$$

If the above is inserted in equation (4)', $$\frac{\Delta V_{OL}}{\Delta T_j} = -\frac{R_C}{R_E}\left(\frac{R_1}{R_1 + R_2} \cdot \frac{\Delta V_D}{\Delta T_j} - \frac{\Delta V_{BE}}{\Delta T_j}\right) \quad (5)$$

From equation (3), $$\frac{\Delta V_{OH}}{\Delta T_j} = 0 \quad (6)$$

From equation (4), $$\frac{\Delta V_{BB}}{\Delta T_j} = -\frac{R_3}{R_4}\left(\frac{\Delta V_{CS}}{\Delta T_j} - \frac{\Delta V_{BE}}{\Delta T_j}\right) \quad (7)$$

-continued $$= -\frac{R_3}{R_4}\left(\frac{R_1}{R_1 + R_2} \cdot \frac{\Delta V_D}{\Delta T_j} - \frac{\Delta V_{BE}}{\Delta T_j}\right)$$

It the temperature dependence of the voltage drop of the diode is nearly equal to the temperature dependence of the voltage drop across the base and emitter of the transistor, the above equations (5) and (7) can be given as follows:

$$\Delta V_{OL}/\Delta T_j = \frac{R_C}{R_E} \cdot \frac{R_2}{R_1 + R_2} \cdot \frac{\Delta V_{BE}}{\Delta T_j} \quad (5)'$$

$$\Delta V_{BB}/\Delta T_j = \frac{R_3}{R_4} \cdot \frac{R_2}{R_1 + R_2} \cdot \frac{\Delta V_{BE}}{\Delta T_j} \quad (7)'$$

Since the current-source voltage level $V_{CS}$ has been applied to the base of the transistor $T_4$, the voltage is dropped by 0.4 volt as represented as $-2.0$ V($V_{EE}$) + 0.9 V($V_{CS}$) + 0.7 V($V_{BE}$) = $-0.4$ V. Since the reference voltage level $V_{BB}$ is $-0.2$ V, $R_3/R_4$ becomes 0.5. From the foregoing, it could be said that the temperature characteristics of the circuit of FIG. 2 are roughly desirable. The dependence of the power-supply voltage, however, becomes as mentioned below.

From equations (2), (3) and (4), when the voltage is changed by $\Delta V_{EE}$, the voltage dependence of the output level is, from equation (3), $$\Delta V_{OH}/\Delta V_{EE} = 0 \quad (8)$$

and, from equation (4), $$\Delta V_{OL}/\Delta V_{EE} = -\frac{R_C}{R_E}\left(\frac{\Delta V_{CS}}{\Delta V_{EE}} - 1\right) \quad (9)$$

Here, from equation (1), $$\frac{\Delta V_{CS}}{\Delta V_{EE}} = \frac{R_1}{R_1 + R_2}$$

If this relation is inserted in equation (9)

$$\frac{\Delta V_{OL}}{\Delta V_{EE}} = \frac{R_C}{R_E} \cdot \frac{R_2}{R_1 + R_2} \quad (10)$$

From equation (4), there is obtained $$\frac{\Delta V_{BB}}{\Delta V_{EE}} = -\frac{R_3}{R_4}\left(\frac{\Delta V_{CS}}{\Delta V_{EE}} - 1\right) = \frac{R_3}{R_4} \cdot \frac{R_2}{R_1 + R_2} \quad (11)$$

The voltage drop through the resistors $R_1$ and $R_2$ is $-V_{EE} + V_D$; the voltage drop, therefore, is $-2.0$ V($V_{EE}$) + 0.7 V($V_D$) = 1.3 V. Further, since the voltage drop through the resistor $R_2$ is 0.4 volt like the case of the resistor $R_4$, there is obtained a ratio $R_2/(R_1 + R_2) = 0.3$. Therefore, from equations (10) and (11), $\Delta V_{OL}/\Delta V_{EE} = 0.3$, and $\Delta V_{BB}/\Delta V_{EE} = 0.15$. In this way, since the dependence of the low output level upon $V_{EE}$ is as great as 30%, and the voltage dependence of the reference voltage upon $V_{EE}$ is also as great as 15%, the circuit of FIG. 2 is not capable of providing noise margin with the amplitude of 0.4 volt, and makes it impossible to create a the circuit which operates on low power-supply voltage and on small amplitude.

Figure 3:
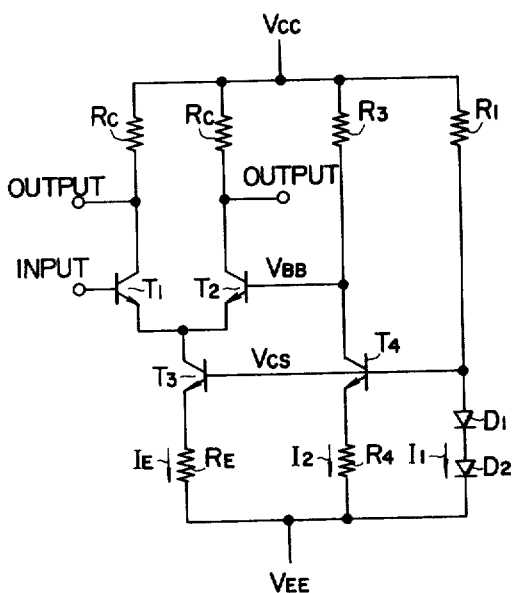
FIG. 3 is a current mode logic circuit in prior art having a biasing circuit composed of diodes connected in series.

Referring to a circuit of FIG. 3, the current-souce voltage $V_{CS}$ is generated by dropping the power-supply voltage $V_{EE}$ through two junction type diodes $D_1$ and $D_2$ in an attempt to eliminate the dependence upon the power supply, that was a problem with the circuit of FIG. 2.

In the circuit of FIG. 3, the diode $D_2$ is used instead of the resistor $R_2$ that was used in the circuit of FIG. 2.

In this case, $V_{EE}$ is $V_{CS} - 2\,V_D$ and is about $-2.3$ volts, which is greater than that of the circuit of FIG. 2. The dependence of the circuit of FIG. 3 upon the power-supply voltage is examined below.

Here, the currents $I_1$, $I_2$, $I_E$ and potentials $V_{CS}$, $V_{BB}$ are same as those of the circuit shown in FIG. 2.

$$V_{CS} = V_{EE} + 2\,V_D(I_1)$$

When the power-supply voltage is changed by $\Delta V_{EE}$, the dependence upon the power-supply voltage can be found in the following way. Here, since $2\,V_D$ is constant, $$\frac{\Delta V_{CS}}{\Delta V_{EE}} = 1 \quad (12)$$

Therefore, from equations (2), (3) and (4), $$\frac{\Delta V_{OL}}{\Delta V_{EE}} = -\frac{R_C}{R_E}\left(\frac{\Delta V_{CS}}{\Delta V_{EE}} - 1\right) \quad (13)$$

If equation (12) is inserted in equation (13), $$\frac{\Delta V_{OL}}{\Delta V_{EE}} = 0 \quad (14)$$

From equation (3), $$\frac{\Delta V_{OH}}{\Delta V_{EE}} = 0 \quad (15)$$

From equation (4), $$\frac{\Delta V_{BB}}{\Delta V_{EE}} = -\frac{R_3}{R_4}\left(\frac{\Delta V_{CS}}{\Delta V_{EE}} - 1\right)$$

If equation (12) is inserted in the above relation, $$\frac{\Delta V_{BB}}{\Delta V_{EE}} = 0 \quad (16)$$

As represented by equations (14), (15) and (16), with the circuit of FIG. 3 it is possible to eliminate the dependence upon the power-supply voltage. In regard to the dependence upon the temperature, however, the following relations can be derived from equations (4)', (5) and (6).

$$\frac{\Delta V_{OH}}{\Delta T_j} = 0 \quad (17)$$

$$\frac{\Delta V_{OL}}{\Delta T_j} = -\frac{R_C}{R_E}\left(2\frac{\Delta V_D}{\Delta T_j} - \frac{\Delta V_{EE}}{\Delta T_j}\right) \quad (18)$$

$$\frac{\Delta V_{BB}}{\Delta T_j} = \frac{R_3}{R_4}\left(2\frac{\Delta V_D}{\Delta T_j} - \frac{\Delta V_{BE}}{\Delta T_j}\right) \quad (19)$$

If the temperature dependence of the voltage drop through the diode is nearly equal to the temperature dependence of the voltage drop across the base and emitter of the transistor, the above equations (18) and (19) can be expressed as follows:

$$\frac{\Delta V_{OL}}{\Delta T_j} = -\frac{R_C}{R_E} \cdot \frac{\Delta V_{BE}}{\Delta T_j} \quad (18)'$$

$$\frac{\Delta V_{BB}}{\Delta T_j} = -\frac{R_3}{R_4} \cdot \frac{\Delta V_{BE}}{\Delta T_j} \quad (19)'$$

With the circuit of FIG. 3, according to the above equations, the temperature dependence of the low output level is $$-\frac{\Delta V_{BE}}{\Delta T_j},$$

and the temperature dependence of the reference voltage is 0.5.

$$\frac{\Delta V_{BE}}{\Delta T_j}.$$

Therefore, if it is intended to assemble a large-scale integrated logic circuit in which it is very defficult to reduce $\Delta T_j$, the circuit of FIG. 3 is not capable of providing noise margin with the amplitude of 0.4 volt, and therefore makes it impossible to create a circuit which operates on low power-supply voltage and on small signal amplitude.

With the circuits shown in FIG. 2 and FIG. 3, it is not possible to satisfy the characteristics of temperature dependence and the power-supply voltage dependence.

According to the present invention, therefore, a large-scale integrated logic circuit is disclosed which operates on reduced power-supply voltage and small amplitude at high speeds consuming less electric power.

In order for the circuit to operate on reduced power-supply voltage and on small amplitude, the emitter follower is removed and the circuit is designed on the basis of a collector-drive system to simplify the circuit arrangement. Further, in order to insure the noise margin, compensation is effected in regard to the power-supply voltage and the temperature. For this purpose, the power-supply circuit is made up of a series circuit including at least a Schottky diode. The diode compensates the base-emitter voltage variation in the forward direction of the transistor caused by temperature and, as a result, offsets the temperature dependency of the transistor characteristics. Unlike the resistor $R_2$ shown in FIG. 2, the Schottky diode generates a almost constant voltage irrespective of the variation in power-supply voltage.

Further, unlike the diode $D_1$ of FIG. 3, the Schottky diode has a small voltage in the forward direction as well as very small dependence upon the temperature, and makes it possible to minimize the noise that will be produced by the change in temperature and power-supply voltage.

Figure 4:
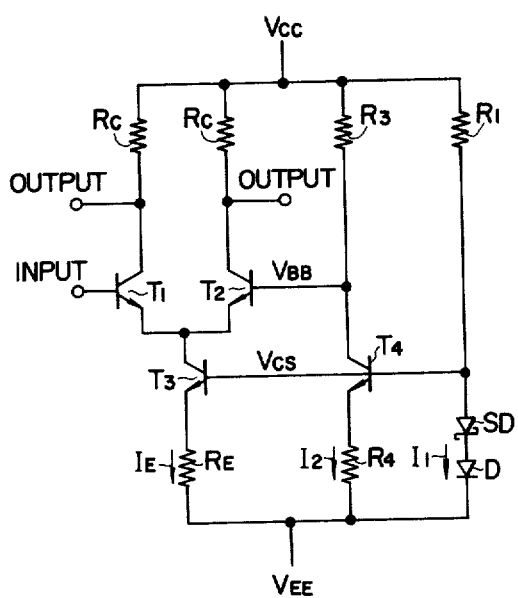
FIG. 4 is a circuit diagram of an embodiment of this invention.

FIG. 4 shows an embodiment according to the present invention, in which a Schottky diode SD is inserted in the place of diode $D_1$ to replace for the diode $D_1$ of FIG. 3.

Referring to the circuit of FIG. 4, a current switch is constituted by means of transistors $T_1$ and $T_2$, and collector resistors are connected to the collectors of the individual transistors, thereby to take out the voltage applied to the collector resistors as an output voltage. To the current switch is connected a transistor $T_3$ which serves as a constant-current supply. A current-source voltage level $V_{CS}$ is applied to the base of the transistor $T_3$. A resistor $R_1$, a Schottky diode SD and a junction type diode D are connected in series between the ground potential $V_{CC}$ and the power-supply potential $V_{EE}$, so that a current-source voltage level $V_{CS}$ is generated by the voltage drop through the Schottky diode SD and the diode D. A constant-current circuit is composed of a resistor $R_4$ and a transistor $T_4$, and said current-source voltage level $V_{VS}$ is applied to the base of the transistor $T_4$. The reference voltage level $V_{BB}$ is produced by the voltage drop through a resistor $R_3$ owing to a constant current which flows into the transistor $T_4$, and is applied to the base of the transistor $T_2$.

A biasing current is allowed to flow into a series circuit consisting of resistor $R_1$, Schottky diode SD and diode D, and a constant voltage drop which is a sum $V_{SD}+V_D$ of the forward voltage $V_{SD}$ of the Schottky diode SD and the forward voltage $V_D$ of the diode D is produced with respect to the power-supply voltage $V_{EE}$.

With the abovementioned circuit, if the power-supply potential $V_{EE}$ undergoes variation, the current-source voltage level $V_{CS}$ varies accordingly, but voltage drop $V_{SD}+V_D$ almost never varies. In this case, the emitter resistors $R_E$ and $R_4$ of the transistors $T_3$ and $T_4$ are served with a constant voltage, whereby the base-emitter biasing voltages of the transistor $T_3$ and $T_4$ are almost constant. As the result, the transistors $T_3$ and $T_4$ produce a constant collector current irrespective of the variation in power-supply voltage $V_{EE}$. Thus, the output level and the reference voltage $V_{BB}$ are compensated for the power-supply voltage.

The voltage in the forward direction of the Schottky diode can be reduced as compared to ordinary diodes. If the voltage in the forward direction of the Schottky diode is reduced to be nearly equal to a low logic amplitude of 0.4 volt, the power-supply potential $V_{EE}$ may be set at $-2$ volts. In this case, the dependence upon the temperature can be represented by the following equation $$V_{CS} = V_{EE} + V_{SD}(I_1) + V_D(I_1) \quad (20)$$

where $V_{SD}(I_1)$ represents a voltage drop by the current $I_1$ through the Schottky diode.

From equation (20), the dependence upon the temperature can be written as $$\frac{\Delta V_{CS}}{\Delta T_j} = \frac{\Delta V_{SD}}{\Delta T_j} + \frac{\Delta V_D}{\Delta T_j} \quad (21)$$

Therefore, from equation (2), $$\frac{\Delta V_{OL}}{\Delta T_j} = -\frac{R_C}{R_E}\left(\frac{\Delta V_{CS}}{\Delta T_j} - \frac{\Delta V_{BE}}{\Delta T_j}\right)$$

If equation (21) is inserted, $$\frac{\Delta V_{OL}}{\Delta T_j} = -\frac{R_C}{R_E}\left(\frac{\Delta V_{SD}}{\Delta T_j} + \frac{\Delta V_D}{\Delta T_j} - \frac{\Delta V_{BE}}{\Delta T_j}\right)$$

Since the temperature dependence of the voltage drop $V_D$ through the diode is nearly equal to the temperature dependence of the voltage $V_{BE}$ across the base and emitter of the transistor $$\frac{\Delta V_D}{\Delta T_j} \approx \frac{\Delta V_{BE}}{\Delta T_j} \quad (22)$$

Hence, $$\frac{\Delta V_{OL}}{\Delta T_j} = -\frac{R_C}{R_E} \cdot \frac{\Delta V_{SD}}{\Delta T_j} \quad (23)$$

From equation (3), $$\frac{\Delta V_{OH}}{\Delta T_j} = 0 \quad (24)$$

From equation (4), $$\frac{\Delta V_{BB}}{\Delta T_j} = -\frac{R_3}{R_4}\left(\frac{\Delta V_{CS}}{\Delta T_j} - \frac{\Delta V_{BE}}{\Delta T_j}\right) \quad (25)$$

If equations (21) and (22) are inserted in equation (25), $$\frac{\Delta V_{BB}}{\Delta T_j} = -\frac{R_3}{R_4} \cdot \frac{\Delta V_{SD}}{\Delta T_j} \quad (26)$$

The temperature dependence of the transistors $T_3$ and $T_4$ that serve as a constant current supply is corrected by the diode D, and the temperature dependence of the low output level and the reference voltage depends only upon the characteristics of the Schottky diode SD. The temperature dependence of the voltage in the forward direction of the Schottky diode is very small as compared to that of an ordinary diode.

$$\frac{\Delta V_{SD}}{\Delta T_j} << \frac{\Delta V_D}{\Delta T_j} \quad (16)$$

Therefore, the temperature dependence of equations (14) and (15) is small, making it possible to compensate for the temperature.

The voltage dependence of this circuit is not affected by the change in power-supply voltage because, as is the circuit of FIG. 3, the voltage drop due to the diode D and the Schottky diode SD is maintained almost constant.

Therefore, the power-supply voltage compensation and the temperature compensation are made compatible for the reference voltage which is used for determining the output level and the threshold level, while it is possible to obtain a noise margin with a signal amplitude of 0.4 volt. Further, since the voltage in the forward direction of the Schottky diode is small, the circuit can be driven on a low power-supply voltage.

As mentioned in the foregoing, a CML circuit has been disclosed which operates on reduced amplitude and on low power-supply voltage, consuming reduced amount of electric power.

Although the embodiment was illustrated giving importance to the circuit which operates on reduced amplitude and on low power-supply voltage, it should be noted that the invention is not limited to such CML circuits only but encompasses the circuits which operate on a conventionally employed signal amplitude of 0.8 bolt, without being affected by the change in temperature or change in power-supply voltage and providing increased noise margin.

What is claimed is:

1. A logic circuit including emitter-coupled transistors, the base of one of which being supplied with an input signal, the base of the other being served with a voltage; a regulation transistor for regulating the emitter current of said coupled transistors, a biasing means having a series connection of a junction diode and a Schottky diode, said means generating a predetermined voltage between the emitter and the base of said regulation transistor; and an output terminal being coupled to at least one collector of the transistors.

2. A logic circuit including emitter-coupled transistors, the base of one of which being supplied with an input signal, the base of the other being served with a reference voltage; a regulation transistor for regulating the emitter current of said emitter-coupled transistors; a biasing means having a series connection of a junction diode and; a Schottky diode, said means generating a predetermined voltage between the emitter and the base of the regulation transistor; and an output terminal being coupled to at least one collector of the transistors.

3. A logic circuit as set forth in claim 2, wherein said regulation transistor is coupled to the emitters of said emitter-coupled transistors.

4. A current switch circuit comprising; an input transistor being supplied with input signals through the base thereof; a reference transistor being served with a reference voltage through the base thereof, the emitter thereof being connected to the emitter of said input transistor; a regulation transistor connected in common to the emitters of said input and reference transistors for regulating the emitter currents; a biasing means having a series connection of a junction diode and a Schottky diode, said means generating a predetermined voltage between the emitter and the base of the regulation transistor; and an output terminal being coupled to at least one collector of said input and reference transistors.

5. A current mode logic circuit comprising; an input transistor being supplied with input signals through the base thereof; a reference transistor being provided with a reference voltage through the base thereof, the emitter thereof being connected to the emitter of said input transistor; a regulation transistor connected in common to the emitters of said input and reference transistors for regulating the emitter currents; a resistor connected to the emitter of said regulation transistor; a biasing means having a series connection of a junction diode and a Schottky diode connected in parallel between the base of said regulation transistor and said resistor; and an output terminal being coupled to at least one collector of said input and reference transistors.

6. A current mode logic circuit as set forth in claim 5, wherein said biasing means include a biasing transistor, the collector thereof being connected to the base of said reference transistor for providing the reference voltage and a resistor connected to the emitter of said biasing transistor, the base of said biasing transistor and said resistor constituting a series circuit which circuit is in parallel with said series connection.

7. A current mode logic circuit comprising; an input transistor being supplied with input signals through the base thereof; a reference transistor being given with a reference voltage through the base thereof; the emitter thereof being connected to the emitter of said input transistor; a regulation transistor connected in common through the collector thereof to the emitters of said input and reference transistors for regulating the emitter currents; load resistors coupled respectively to the collectors of said input and reference transistors for generating an output signal; a first resistor being coupled to the emitter of said regulation transistor; a biasing circuit having a series connection of a junction diode and a Schottky diode which are coupled in parallel between said first resistor and the base of said regulation transistor, and a biasing transistor, the collector thereof being coupled to the base of said reference transistor for giving the reference voltage, the emitter thereof being coupled to a second resistor, the base thereof and said second resistor being coupled in parallel to said series connection; and a power supply source having a first power terminal connected to said load resistors respectively and a second power terminal connected the first resistor for providing a power potential.

8. A current mode logic circuit as set forth in claim 7, wherein said biasing circuit includes first and second biasing resistors, the first biasing resistor being coupled between the base of said biasing transistor and said load resistors respectively, and the second biasing resistor being coupled between the collector of said biasing transistor and said load resistors respectively.

9. A current logic circuit as set forth in claim 7 or claim 8, wherein said first power terminal is connected to the ground potential.

10. In a logic circuit, with power supply, including emitter-coupled transistors, the base of one of which being supplied with an input signal, the base of the other being served with a voltage; a regulation transistor for regulating the emitter current of said coupled transistors, a biasing means having a series connection including at least a junction diode, said biasing means generating a predetermined voltage between the emitter and the base of said regulation transistor; and an output terminal being coupled to at least one collector of the transistors the improvement comprising means for rendering the logic circuit substantially stabilized against variations in power supply voltage by stabilizing said voltage served to the base of the said other transistor, comprising in series with said junction diode, a Schottky diode.

* * * * *